(12) United States Patent
Yu

(10) Patent No.: US 8,003,983 B2
(45) Date of Patent: Aug. 23, 2011

(54) WAFER FOR MANUFACTURING IMAGE SENSORS, TEST KEY LAYOUT FOR DEFECTS INSPECTION, AND METHODS FOR MANUFACTURING IMAGE SENSORS AND FOR FORMING TEST KEY

(75) Inventor: Cheng-Hung Yu, Kao-Hsiung (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 1407 days.

(21) Appl. No.: 11/379,229

(22) Filed: Apr. 19, 2006

(65) Prior Publication Data
US 2007/0246639 A1 Oct. 25, 2007

(51) Int. Cl.
*H01L 23/544* (2006.01)
(52) U.S. Cl. .................. 257/48; 257/E23.179
(58) Field of Classification Search .......... 257/48, 257/E23.179; 365/502
See application file for complete search history.

(56) References Cited

U.S. PATENT DOCUMENTS

| | | | |
|---|---|---|---|
| 6,538,264 B2* | 3/2003 | Corbett et al. | 257/48 |
| 6,636,064 B1* | 10/2003 | Satya et al. | 324/763 |
| 7,268,009 B2* | 9/2007 | Hwang | 438/70 |
| 7,291,507 B2* | 11/2007 | Bidermann et al. | 438/14 |
| 7,445,950 B2* | 11/2008 | Joon | 438/57 |
| 7,655,482 B2* | 2/2010 | Satya et al. | 438/17 |
| 2006/0000964 A1* | 1/2006 | Ye et al. | 250/208.1 |
| 2006/0021439 A1* | 2/2006 | Kerr et al. | 73/649 |
| 2006/0064268 A1* | 3/2006 | Dorough et al. | 702/117 |
| 2006/0193532 A1* | 8/2006 | Roberts et al. | 382/255 |
| 2006/0209292 A1* | 9/2006 | Dowski et al. | 356/121 |
| 2006/0215175 A1* | 9/2006 | Yacoubian | 356/502 |
| 2009/0230290 A1* | 9/2009 | Tashiro et al. | 250/214 A |

* cited by examiner

*Primary Examiner* — Nathan W Ha
(74) *Attorney, Agent, or Firm* — Winston Hsu; Scott Margo

(57) ABSTRACT

A wafer for manufacturing image sensors is disclosed. The wafer includes an image sensor and a test key. The image sensor includes a plurality of micro-lenses; the test key includes a plurality of micro-lens samples for defects inspection. The arrangement of the micro-lens samples on the test key is substantially different from the arrangement of the micro-lenses on the image sensor. The arrangement of the micro-lens samples on the test key allows defects inspection to become less complicated.

4 Claims, 3 Drawing Sheets

(A)
Top view of image sensor (B)
Exemplary top view of test key

Micro-lenses formed on cross-section AA'

Micro-lens samples formed on cross-section BB'

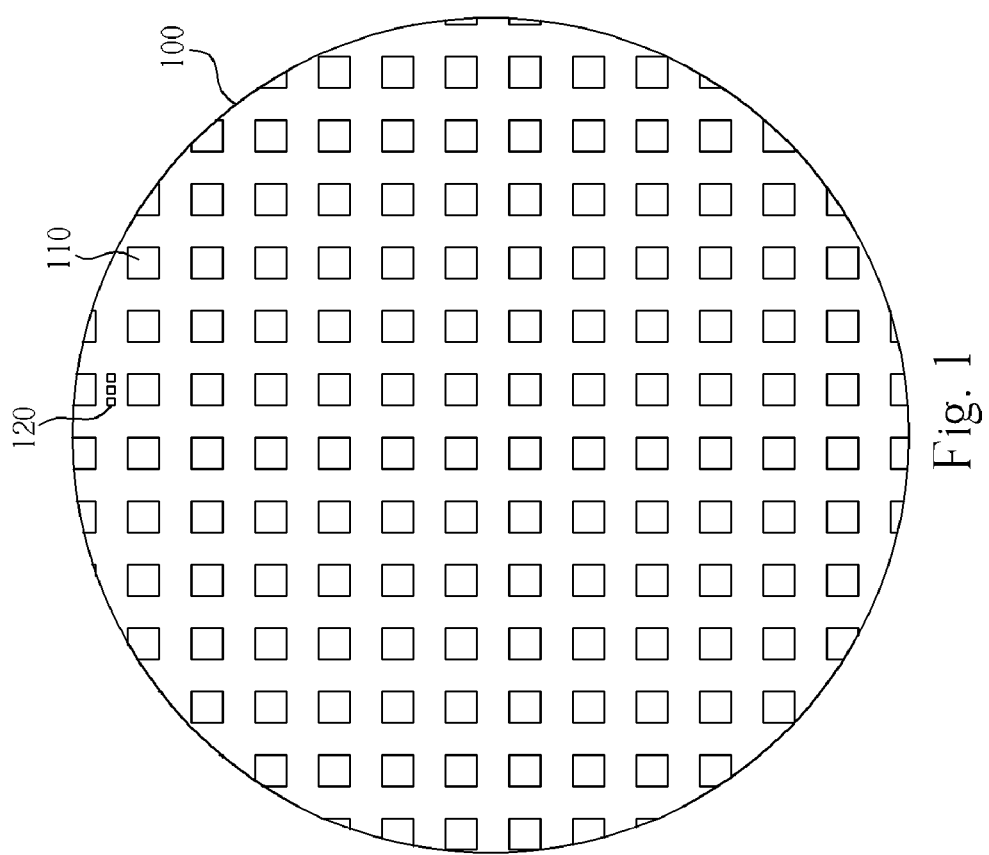

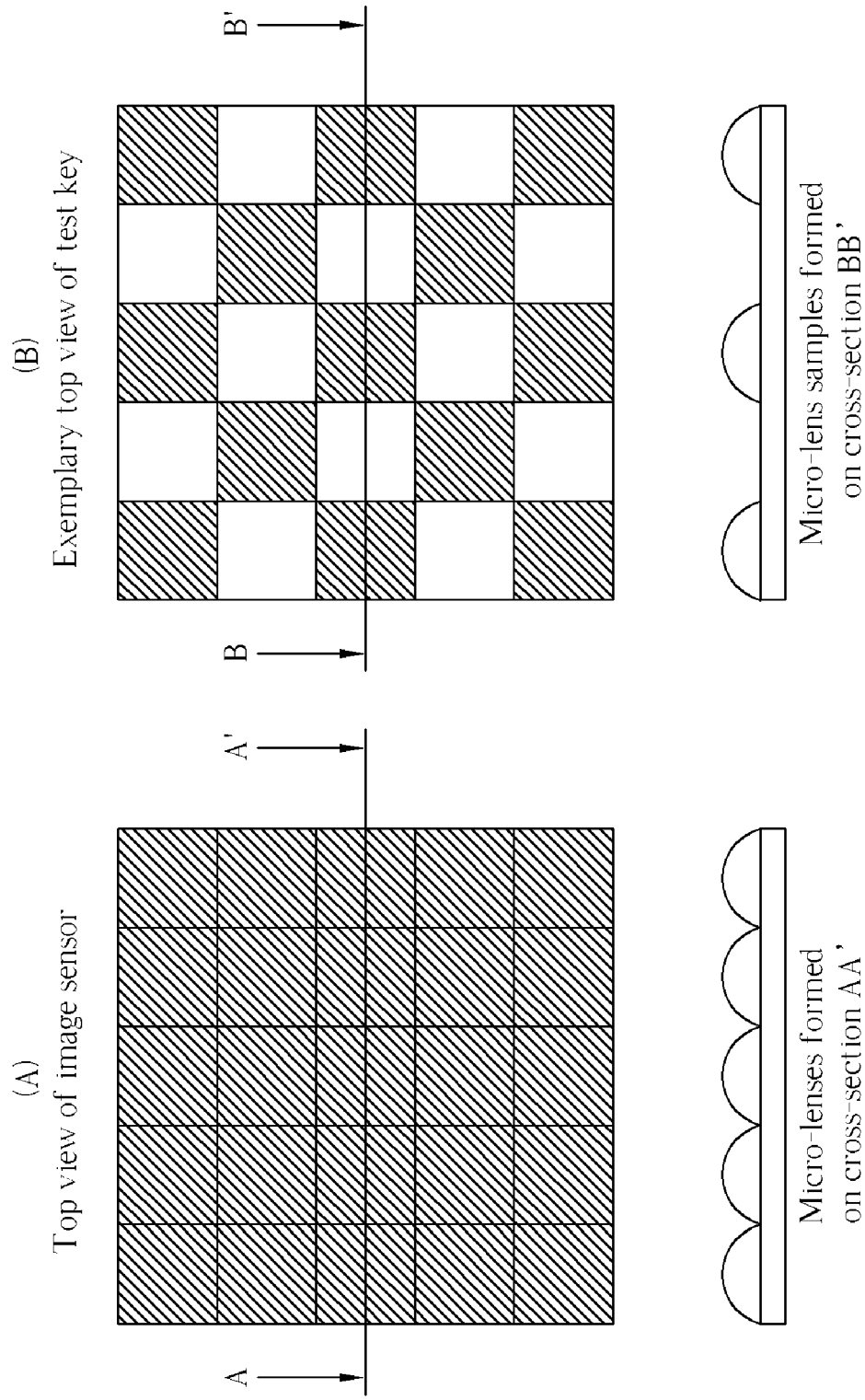

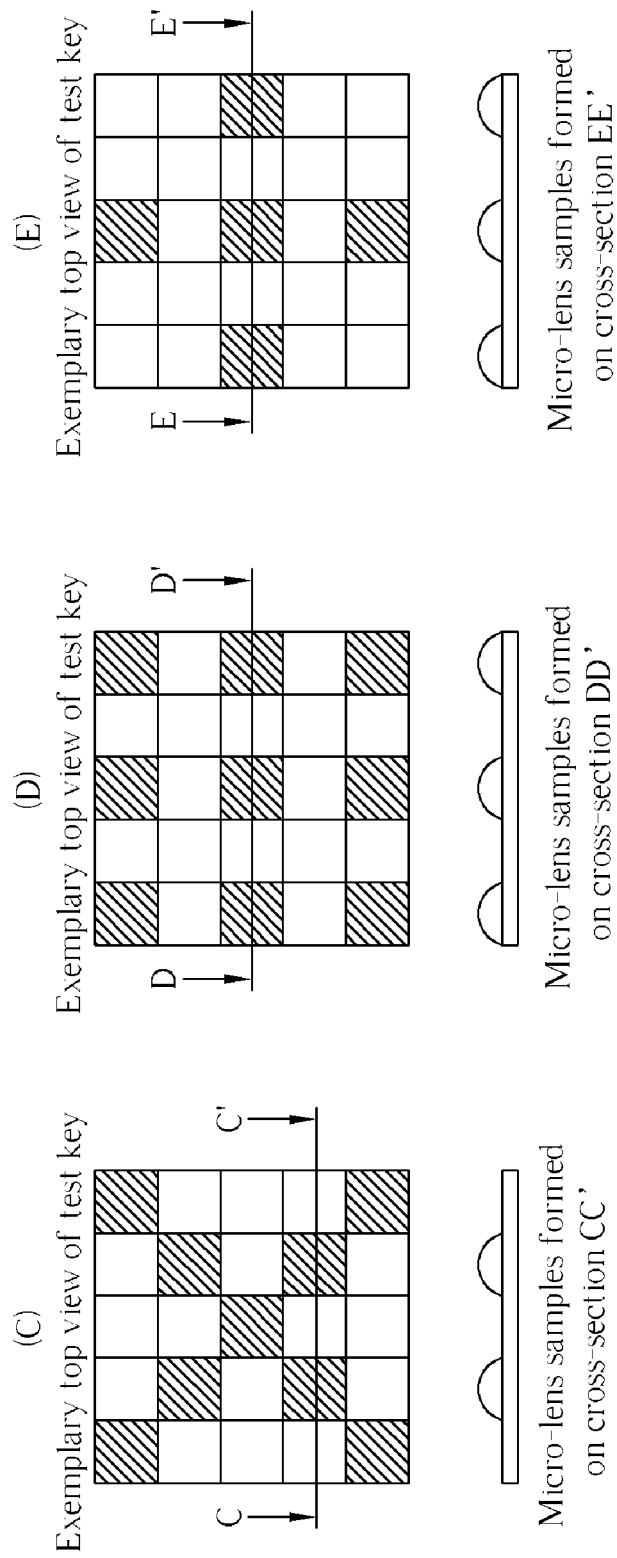

WAFER FOR MANUFACTURING IMAGE SENSORS, TEST KEY LAYOUT FOR DEFECTS INSPECTION, AND METHODS FOR MANUFACTURING IMAGE SENSORS AND FOR FORMING TEST KEY

BACKGROUND OF THE INVENTION

1. Field of the Invention

The present invention relates to micro-lenses of image sensors, and more particularly, to defects inspection on micro-lenses of image sensors.

2. Description of the Prior Art

Image sensors are integrated circuit (IC) components that can be used to capture still images or motion pictures. It is well known that an image sensor can be of either the complimentary metal oxide semiconductor (CMOS) type or the charge coupled device (CCD) type. No matter what type an image sensor belongs to, it is made up of a two-dimensional array of light detecting pixels. Up-to-date image sensors usually include millions of pixels in the two-dimensional array so as to provide images with high resolution.

Generally speaking, each light detecting pixel of an image sensor is composed of three main parts: a micro-lens for gathering incident light, a color filter for filtering the light that has already passed through the micro-lens, and a light detecting element set substantially on the focal point of the micro-lens for detecting the light after it has been filtered by the color filter.

Conventionally, micro-lenses are formed by spin coating a layer of micro-lens material onto a surface of the image sensor. The micro-lens material is then developed to form cubical/cylindrical regions or other shaped regions that are centered above each pixel. After the micro-lens material is heated, each cubical/cylindrical region re-flows to form a convex hemispherical micro-lens.

The above-mentioned micro-lens forming process is important and may greatly influence the image capturing ability of the image sensors. For example, in order to increase the light gathering efficiency, each of the micro-lenses should be as large as possible. However, it is undesirable for the individual micro-lenses to contact with each other and thereby interfere. After being heated, if any cubic of the micro-lens material over re-flows, it might contact with another adjacent micro-lens. The unwanted contact between two adjacent micro-lenses caused by over re-flow is referred to as "micro-bridge," which is a kind of defect that deteriorates the image capturing ability of the image sensor. In short, it is desired that the micro-lenses be as close to each other as possible without the existence of micro-bridges.

In addition, curvature of the micro-lenses is another characteristic that should be carefully controlled. If the micro-lens forming process is performed unsuccessfully, the curvature of the micro-lenses may deviate from a required value, and the image capturing ability of the image sensor will be deteriorated.

In the related art, after a wafer for manufacturing image sensors has gone through the micro-lens forming process, in-line (or in-Fab) product monitoring will be performed on the image sensors to determine whether or not the micro-lenses are properly formed on the image sensors. Ideally, defects such as micro-bridges and incorrect curvatures should be detected through the monitoring process. However, since the micro-lenses are tightly arranged on the image sensors, the monitoring process performed on one micro-lens or a joining point of two micro-lenses will inevitably be influenced by other adjacent micro-lenses. In other words, since the micro-lenses are tightly arranged on the image sensors, it is difficult to determine whether the micro-lens forming process is successfully performed or not through performing the in-line monitoring process.

SUMMARY OF THE INVENTION

It is therefore one objective of the claimed invention to provide a wafer for forming image sensors thereon, wherein the wafer comprises a test key that allows defects inspection to become less complicated. The related method and related test key layout are also disclosed.

According to the claimed invention, a wafer for manufacturing image sensors is disclosed. The wafer comprises an image sensor and a test key. The image sensor comprises a plurality of micro-lenses; the test key comprises a plurality of micro-lens samples for defects inspection. The arrangement of the micro-lens samples on the test key is substantially different from the arrangement of the micro-lenses on the image sensor.

According to the claimed invention, a method for manufacturing image sensors is disclosed. The method comprises forming an image sensor and a test key on a wafer. The image sensor comprises a plurality of micro-lenses; the test key comprises a plurality of micro-lens samples. The arrangement of the micro-lens samples on the test key is substantially different from the arrangement of the micro-lenses on the image sensor. The method further comprises detecting characteristics of the micro-lens samples on the test key.

According to the claimed invention, a test key layout for defects inspection is disclosed. The test key layout is implemented on a wafer for manufacturing image sensors. The test key layout comprises a plurality of areas each allowing one micro-lens sample to be formed thereon. A plurality of micro-lens samples is also included in the test key layout, where each micro-lens sample is formed upon one of the areas. The amount of the micro-lens samples is substantially less than the amount of the areas.

According to the claimed invention, a method for forming a test key on a test key region of a wafer is disclosed. The wafer is for manufacturing image sensors. The method comprises allotting a plurality of areas on the test key region and forming a plurality of micro-lens samples. Each of the areas allows one micro-lens sample to be formed thereon. Each of the micro-lens samples is formed upon one of the areas. The amount of the micro-lens samples is substantially less than the amount of the areas.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 shows a top view of a wafer according to an embodiment of the present invention.

FIG. 2 shows exemplary top views and cross-sections of an image sensor and a test key of FIG. 1.

FIG. 3 shows top views and cross-sections of the test key of FIG. 1 according to three other micro-lens sample arrangement manners.

DETAILED DESCRIPTION

In practice, to increase yield rate in mass production, semiconductor manufacturers can specifically design various types of test keys for finding defects caused by unanticipated processing errors. Once a defect is detected, the cause of the failure can be inferred and later rectified. Therefore, in embodiments of the present invention, test keys will be specifically designed to make defects inspection easier. FIG. 1 shows a top view of a wafer 100 according to an embodiment of the present invention. In FIG. 1, several image sensors 110 are formed on the wafer 100 with a matrix distribution. Aside from the image sensors 110, at least one test key 120 is also formed on a test key region, such as a scribe line or a peripheral area, of the wafer 100. The goal of setting the test key 120 is to facilitate an in-line (or in-Fab) monitoring process. Each of the image sensors 110 comprises a plurality of micro-lenses, which are not shown in this figure; and each of the test keys 120 comprises a plurality of micro-lens samples, which are not shown in this figure, either. In this embodiment, the size and shape of each of the micro-lens samples on the test key 120 is substantiality the same as that of the micro-lenses on the image sensors 110.

In this embodiment, the arrangement of the micro-lens samples on the test key 120 is substantially different from the arrangement of the micro-lenses on the image sensors 110. More specifically, on each one of the image sensors 110 the micro-lenses are tightly arranged in a neat two-dimensional array so as to provide a high resolution. On the test key 120, however, the micro-lens samples are arranged in a way different from how the micro-lenses are arranged on the image sensors 110. The arrangement of the micro-lens samples on the test key 120 is for letting the in-line monitoring process become less complicated. From another point of view, the density of micro-lens samples on the test key 120 is substantially smaller than the density of micro-lenses on the image sensor 110. Because the micro-lens samples on the test key 120 have a smaller density, the monitoring process performed on one micro-lens sample or a joining point of two micro-lens samples formed on the test keys 120 will less likely be influenced by other adjacent micro-lens samples.

FIG. 2 shows exemplary top views of an image sensor 110 and a test key 120. Micro-lenses or micro-lens samples formed on some cross-sections are also shown in FIG. 2. In FIG. 2, only 25 squares are shown in the top view of the image sensor 110 and only 25 squares are shown in the top view of the test key 120. Each of the squares represents an area that allows one micro-lens (or one micro-lens sample) to be set thereon. In the top views, if a square is filled with oblique lines, it means that a micro-lens (or a micro-lens sample) is formed on the area represented by the square. If the interior part of a square is blank, it means that no micro-lens (or micro-lens sample) is formed on the area represented by the square. On the image sensor 110, micro-lenses are tightly arranged in a two-dimensional array. In other words, all of the areas are occupied by micro-lenses. A high photo sensibility can therefore be provided by the image sensor 110. On the test key 120, however, micro-lens samples are allocated on only part of the areas represented by the squares. The arrangement of the micro-lens samples on the test key 120 makes defects inspection of the micro-lens samples during in-line (or in-Fab) monitoring a simplified task, since observation/measurement being performed on a micro-lens sample or a joining point of two micro-lens samples of the test key will less likely be influenced by adjacent micro-lens samples. Defects such as over-reflow, which cause micro-bridges to form between adjacent micro-lenses on the image sensor 110, and incorrect curvatures can therefore be easily detected through performing observations or test procedures on the test key 120.

In designing the layout of the test key 120, for instance, a prerequisite to be satisfied is that the arrangement of the micro-lens samples on the test key 120 should facilitate defect inspection. Since not all the square area on the test key 120 is occupied by micro-lens samples, through in-line monitoring it is easier to determining whether over re-flow happens in the micro-lens samples of the test key 120 or not. If over re-flow happens in the micro-lens samples of the test key 120, it can be inferred that micro-bridges might exist between adjacent micro-lenses on the image sensor 110. The actual adopted arrangement of the micro-lens samples on the test key 120 is not limited as long as the prerequisite is satisfied. For example, FIG. 3 shows three other exemplary top views of the test key 120. Micro-lens samples formed on some cross-sections are also shown in FIG. 3.

Conventionally, beneath the micro-lenses of the image sensors there is a color filter layer having alternately changed colors. To let the micro-lens samples on the test key 120 to precisely reveal how the micro-lenses are formed on the image sensor 110, it is preferred the structure beneath the micro-lens samples of the test key 120 is substantially the same as the structure beneath the micro-lenses of the image sensor 110. In other words, it is preferred that a unique color filter forming process is performed on both the test key 120 and the image sensor 110.

Please note that in the embodiment of the present invention, it is preferred that the size/shape of the micro-lens samples formed on the test key 120 is the same as the size/shape of the micro-lenses formed on the image sensors 110. However, this is not a required limitation of the present invention. In other words, the micro-lens samples formed on the test key 120 can have more than one different size/shape, since micro-lens samples with different sizes/shapes can be utilized to detect different kinds (or different extent) of micro-lens defects.

After the test keys 120 and the image sensors 110 have been formed on the wafer 100, testing equipments can then be utilized to inspect characteristics of the micro-lens samples on the test keys 120. The detected characteristics of the micro-lens samples reveal characteristics of the micro-lenses on the image sensors 110 to certain extent. Therefore, through examining the detected characteristics of the micro-lens samples, the manufacturer can determine whether the micro-lens forming process has been performed successfully or not. After examining the detected characteristics of the micro-lens samples, if it is determined that the micro-lens forming process has been performed unsuccessfully, the cause of the failure can be inferred and later rectified.

Herein examples of the testing equipments include optical microscopes, atomic force microscopes (AFM), and scanning electron microscopes (SEM), etc. For instance, when an SEM (or other similar microscope) is used, the test key 120 will be treated as a specimen of the SEM. The SEM generates an electron beam, which is focused by an objective lens of the SEM onto the specimen surface. The secondary electrons reflected off the surface of the specimen are then detected by a scintillator detector of the SEM. A surface image of the specimen can be determined accordingly. Since the micro-lens samples are not tightly arranged on the test key 120, the surface image of the test key 120 can be drawn clearly. After the surface image of the test key 120 is clearly drawn, curvature of the micro-lens samples can be easily determined according to simple geometry formulas. Defects such as over re-flow can also be easily detected by examining the surface image of the test key 120.

If defects, such as over re-flow or incorrect curvatures, are detected on the micro-lens samples of the test keys 120, it is highly probable that micro-bridges or incorrect curvatures also exist on the micro-lenses of the image sensors 110. Under this circumstance, compensation processes can be performed to reduce or eliminate the defects. For example, the compensation processes may include clearing out the already formed micro-lenses and micro-lens samples on the wafer 100 and then re-forming the micro-lenses and micro-lens samples on the wafer 100 with a modified micro-lens forming process. The defect detecting process is re-performed until no unacceptable defect is detected on the micro-lens samples of the test key 120.

With the ideas incorporated in the present invention, in-line monitoring of the micro-lens forming process becomes a simplified task. Characteristics, such as curvature, of the micro-lens sample can be easily determined. Defects such as over-reflow can also be easily detected since the defects inspection process is performed on a test key rather than on an actual image sensor having tightly arranged micro-lenses. Therefore, a higher yield rate can be achieved and a better product quality can be realized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer for manufacturing image sensors, the wafer comprising:
   an image sensor comprising a plurality of micro-lenses; and
   a test key comprising a plurality of micro-lens samples, the arrangement of the micro-lens samples on the test key being substantially different from the arrangement of the micro-lenses on the image sensor.

2. The wafer of claim 1, wherein the density of the micro-lens samples on the test key is substantially smaller than the density of the micro-lenses on the image sensor.

3. The wafer of claim 1, wherein for defects inspection, the shape of at least one of the micro-lens samples on the test key is substantially the same as the shape of the micro-lenses on the image sensor.

4. The wafer of claim 1, wherein for defects inspection, the size of at least one of the micro-lens samples on the test key is substantially the same as the size of the micro-lenses on the image sensor.

* * * * *